(12) United States Patent
Schrank et al.

(10) Patent No.: US 8,378,496 B2
(45) Date of Patent: Feb. 19, 2013

(54) SEMICONDUCTOR SUBSTRATE WITH INTERLAYER CONNECTION AND METHOD FOR PRODUCTION OF A SEMICONDUCTOR SUBSTRATE WITH INTERLAYER CONNECTION

(75) Inventors: Franz Schrank, Graz (AT); Martin Schrems, Eggersdorf (AT); Jochen Kraft, Oberaich (AT)

(73) Assignee: austriamicrosystems AG, Unterpremstaetten (AT)

( * ) Notice: Subject to any disclaimer, the term of this patent is extended or adjusted under 35 U.S.C. 154(b) by 219 days.

(21) Appl. No.: 12/670,303

(22) PCT Filed: Jul. 23, 2008

(86) PCT No.: PCT/EP2008/059662
§ 371 (c)(1),
(2), (4) Date: Jun. 17, 2010

(87) PCT Pub. No.: WO2009/013315
PCT Pub. Date: Jan. 29, 2009

(65) Prior Publication Data
US 2010/0314762 A1 Dec. 16, 2010

(30) Foreign Application Priority Data

Jul. 24, 2007 (DE) .................. 10 2007 034 306

(51) Int. Cl.
*H01L 23/48* (2006.01)
*H01L 21/44* (2006.01)
(52) U.S. Cl. ............... 257/774; 257/741; 257/E21.597; 257/E23.011; 257/E29.112; 438/621; 438/629; 438/630; 438/637; 438/638; 438/639; 438/640; 438/668; 438/672; 438/675
(58) Field of Classification Search .................. 257/741, 257/774, E21.499, E21.576, E23.011, E23.023; 438/621, 629, 630, 637–640, 668, 672, 675
See application file for complete search history.

(56) References Cited

U.S. PATENT DOCUMENTS

| | | | |
|---|---|---|---|
| 5,122,856 A | 6/1992 | Komiya | |
| 5,426,072 A | 6/1995 | Finnila | |
| 5,780,354 A | 7/1998 | Dekker et al. | |
| 6,252,300 B1 * | 6/2001 | Hsuan et al. | 257/686 |
| 6,352,923 B1 | 3/2002 | Hsuan et al. | |
| 6,461,956 B1 | 10/2002 | Hsuan et al. | |
| 7,030,466 B1 | 4/2006 | Hsuan | |
| 7,179,740 B1 | 2/2007 | Hsuan | |
| 2002/0011670 A1 | 1/2002 | Higashi | |
| 2004/0232554 A1 | 11/2004 | Hirano | |
| 2007/0278657 A1 * | 12/2007 | Lee | 257/692 |

FOREIGN PATENT DOCUMENTS

| | | |
|---|---|---|
| DE | 101 41 571 | 3/2003 |
| DE | 10 2006 054 334 | 7/2008 |
| EP | 0 316 799 | 5/1989 |
| FR | 2 797 140 | 2/2001 |
| WO | WO 2006/097842 | 9/2006 |
| WO | WO 2008/035261 | 3/2008 |

* cited by examiner

*Primary Examiner* — Jasmine Clark
(74) *Attorney, Agent, or Firm* — Cozen O'Connor

(57) ABSTRACT

The interlayer connection of the substrate is formed by a contact-hole filling (4) of a semiconductor layer (11) and metallization (17) of a recess (16) in a reverse-side semiconductor layer (13), wherein the semiconductor layers are separated from each other by a buried insulation layer (12), at whose layer position the contact-hole filling or the metallization ends.

17 Claims, 13 Drawing Sheets

SEMICONDUCTOR SUBSTRATE WITH INTERLAYER CONNECTION AND METHOD FOR PRODUCTION OF A SEMICONDUCTOR SUBSTRATE WITH INTERLAYER CONNECTION

RELATED APPLICATIONS

This is a U.S. national stage of application No. PCT/EP2008/059662, filed on Jul. 23, 2008.

This application claims the priority of German application no. 10 2007 034 306.1 filed Jul. 24, 2007, the entire content of which is hereby incorporated by reference.

FIELD OF THE INVENTION

The present invention relates to semiconductor substrates with vertical interlayer connections, especially for vertical or cubic integration.

BACKGROUND OF THE INVENTION

Substrates with interlayer connections between the two main surfaces are needed for the vertical integration of semiconductor circuits. Stacks are formed from such substrates, and in this way complex three-dimensional circuits are built from the integrated electronic components in the individual substrates. The production of long interlayer connections with small diameters requires long etching times, which make the production process expensive. Therefore, the semiconductor bodies are thinned to typical thicknesses of 200 µm to 300 µm before the production of the interlayer connections. Typical aspect ratios, that is, quotients of the length and the diameter of an interlayer connection, are 5:1 or 10:1. In the case of a substrate thickness of, for example, 250 µm, the diameters of the interlayer connections are typically limited to 25 µm to 50 µm. Aspect ratios of more than 50:1 currently lie outside of technical capabilities.

Substrates with interlayer connections and associated production methods are described in U.S. Pat. Nos. 6,461,956 B1, 7,030,466 B1, 5,122,856, and 7,179,740 B1. The method described in U.S. Pat. No. 6,461,956 B1 starts with an SOI (silicone-on-silicone) substrate, in which an insulation layer is arranged between silicon layers. One silicon layer, typically designated as the body silicon layer, is used for the integration of electronic components. The thicker silicon layer, which is typically designated as the bulk silicon layer and which is present on the opposite side of the insulation layer, has an opening, which is filled with a metal connected through an opening in the insulation layer to vertical interlayer connections of the body silicon layer and wiring arranged on this layer. In this way, a vertical electrically conductive connection is formed between a reverse-side terminal and a metallization layer of the top-side wiring.

SUMMARY OF THE INVENTION

It is an object of the present invention to disclose a new semiconductor substrate with interlayer connection and a method of producing semiconductor substrates with interlayer connection.

In an embodiment of the invention, the semiconductor substrate with interlayer connection an insulation layer is embedded in semiconductor material, so that layers of semiconductor material are present on opposite sides of the insulation layer. At least one contact-hole filling is arranged in one of the layers of semiconductor material, so that the contact-hole filling penetrates the layer in which it is arranged up to the insulation layer. A recess with layered metallization deposited in this recess is present on the opposite side, so that this recess penetrates the layer of semiconductor material present on the side of the insulation layer opposite from the contact-hole filling. The insulation layer is removed in the region of the contact-hole filling, and the contact-hole filling and the metallization are connected to each other there in an electrically conductive way. Within the recess the metallization completely covers surfaces of the contact-hole filling and the insulation layer, where these surfaces face toward the recess. Preferably the metallization also has a flat boundary surface with the contact-hole filling and a boundary surface arranged in the same plane with the insulation layer.

The contact-hole filling can be electrically conductive doped polysilicon. This has the advantage that the contact-hole filling can be produced before the production of electronic components, and then a thermal budget unacceptable for electronic components is no longer needed. The contact-hole filling, however, can also be produced from metal to reduce the impedance, with this then preferably being realized after production of the electronic components in the substrate.

In further embodiments the semiconductor substrate with electric interlayer connection has two surfaces opposing each other and an insulation layer that is arranged in a layer position between the surfaces and is spaced relative to each surface. A contact-hole filling is present that reaches from one of the surfaces of the semiconductor substrate up to the layer position of the insulation layer. In addition, a recess is present with a layered metallization deposited in this recess, which reaches from the opposite surface of the semiconductor substrate up to the layer position of the insulation layer. The insulation layer is removed in the region of the contact-hole filling and the contact-hole filling and the metallization are connected to each other there in an electrically conductive way. The metallization and the contact-hole filling have a common boundary surface that is arranged in the interior of the layer position of the insulation layer.

The method uses a semiconductor substrate with an insulation layer embedded in the semiconductor material, up to which portions of the interlayer connections in the semiconductor material are produced on both sides. An etching process used for this purpose stops at the insulation layer. The production process is significantly simplified by means of the boundary of the two portions of the interlayer connections defined by the insulation layer. An SOI substrate can be used, or a substrate with a buried insulation layer limited to a region of the layer plane. An integrated circuit, in particular with CMOS components, can be formed in the semiconductor material on one side of the insulation layer, for example in a body silicon layer. An opening, which is provided for the interlayer connection on this side and which is formed like a kind of contact hole, can be filled with electrically conductive doped semiconductor material, advantageously with polysilicon, before production of the circuit components. After production of the circuit, a larger recess is produced on the reverse side in the semiconductor material present there, for example in a bulk silicon layer. For this purpose, a so-called handling wafer is attached on the front side that allows easier handling of the substrate to be worked. In this way it is possible to thin the substrate from the reverse side, so that overall the substrate has a thickness suitable for an interlayer connection. Advantageously, the reverse-side recess is provided in the semiconductor material with a larger diameter than the front-side opening, and is provided on the inner sides with a metallization, which contacts the front-side contact-hole filling in an electrically conductive way and thus forms the interlayer connection penetrating the entire substrate.

The processing steps comprise providing a substrate made from semiconductor material with an insulation layer embedded in the semiconductor material and producing an opening in the semiconductor material from an upper surface of this substrate, using a mask. Here the insulation layer in the opening is exposed. The surfaces of the semiconductor material exposed in the opening are covered and thus electrically insulated with a dielectric layer, advantageously an oxide of the semiconductor material, such as, for example, silicon dioxide. If necessary, a dielectric formed on the base of the opening, in particular an oxide, is removed or at least thinned. An electrically conductive material is introduced into the opening and thus a contact-hole filling is produced. On the opposite side of the insulation layer, in the region of this contact-hole filling, a recess is produced in the substrate so that the insulation layer in the recess is exposed. The semiconductor material exposed on the side walls in the recess is covered with a dielectric layer, which can also be an oxide. The dielectric layer is removed in the region of the contact-hole filling and metallization is deposited in the recess, such that the metallization electrically contacts the contact-hole filling. Then terminal contact surfaces are produced, which are each connected in an electrically conductive way to the contact-hole filling or to the metallization. In this way the complete interlayer connection of the substrate is produced. Then solder balls may be deposited on the terminal contact surfaces for external electric connection.

DETAILED DESCRIPTION OF THE DRAWINGS

Figure 1:
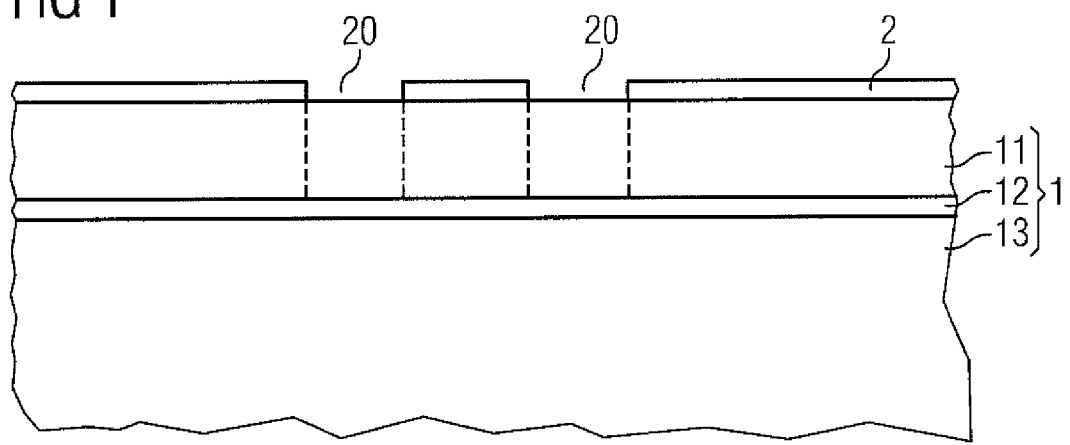
FIG. 1 shows a cross section of an intermediate product of an embodiment of the method after the production of a mask.

FIG. 1 shows in cross section a substrate 1, which has the configuration of an SOI substrate. A relatively thin body silicon layer 11 is separated from a thicker bulk silicon layer 13 by an insulation layer 12. The body silicon layer of an SOI substrate is typically used for the production of the circuit components. For production of the interlayer connection, a mask 2 is deposited on the upper surface of the body silicon layer 11, in particular a resist mask with openings 20. It is sufficient to provide only one opening for each interlayer connection to be produced; but there could also be several openings for each interlayer connection. In the example shown in FIG. 1, two openings 20 are provided for the interlayer connection. Using the mask 2, the semiconductor material of the body silicon layer 11 is removed through the openings 20 from the regions marked with vertical dashed lines in FIG. 1. The semiconductor material is removed up to the insulation layer 12, so that openings are formed in the body silicon layer 11, which are provided as contact holes.

Figure 2:
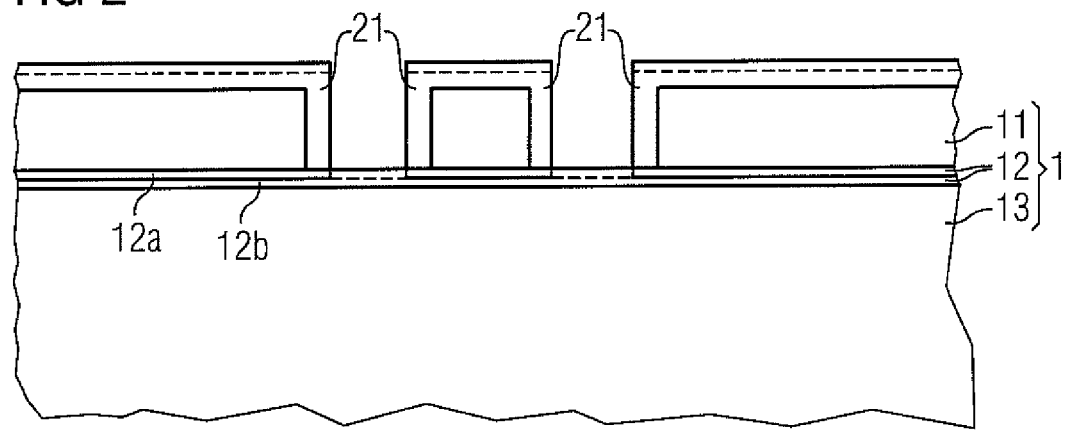
FIG. 2 shows a cross section according to FIG. 1 after insulation of the side walls of the contact holes.

FIG. 2 shows a cross section according to FIG. 1 after etching of the openings and after production of a dielectric layer 21. The dielectric layer 21 can be, in particular, an oxide of the semiconductor material, in this example a silicon oxide, and can be produced by thermal oxidation of the semiconductor material. The dielectric layer 21 is provided to cover and thus electrically insulate the semiconductor material of the body silicon layer 11 on the side walls of the openings. Following this is then an anisotropic etching step, with which layer portions of the dielectric layer 21 and the insulation layer 12 are removed, approximately in the region marked with the dashed lines in FIG. 2. The etching step with which a layer portion of the insulation layer 12 is removed can instead be performed before the production of the dielectric layer 21. In this way, too, a structure is obtained that corresponds to that shown in the cross section of FIG. 2.

In the etching step with which a layer portion of the insulation layer 12 is removed it is advantageous for the insulation layer 12 to be a multiple layer, in which a suitable material of any of the layers forming the multiple layer may especially be an oxide or a nitride of the semiconductor material. For example, an upper layer portion 12a that is removed during etching can be an oxide of the semiconductor material, and another layer portion 12b that is used as an etching stop layer can be a nitride of the semiconductor material. In particular an oxide-nitride-oxide layer sequence is suitable. The nitride layer here functions as an etching stop layer.

Figure 3:
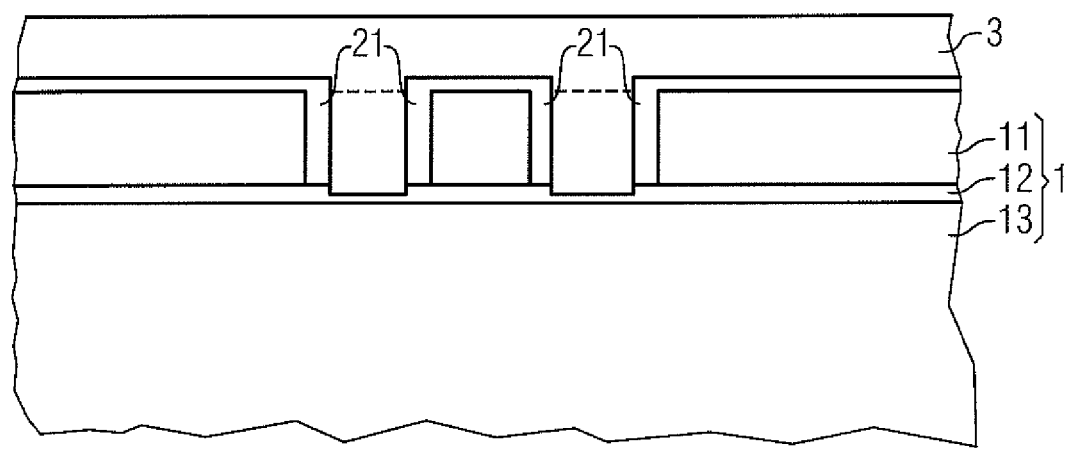
FIG. 3 shows a cross section according to FIG. 2 after the introduction of polysilicon.

The result of the etching step is shown in FIG. 3 in cross section, in which it can be seen that in this embodiment a residual thin layer portion of the insulation layer 12 is left in the region of the openings. The dielectric layer 21 was previously produced with sufficient thickness that residual layer portions of the dielectric layer 21 are still present on the upper surface of the body silicon layer 11. The side walls of the openings are still insulated with the dielectric layer 21. The openings are then filled with an electrically conductive material, in this example with electrically conductive doped polysilicon 3. The polysilicon is preferably doped in situ, that is, during the introduction into the openings. Excess polysilicon is then removed approximately up to the level marked with the horizontal dashed lines in FIG. 3. In the course of a planarization of the upper surface the removal of the polysilicon 3 first stops at the residual layer portions of the dielectric layer 21, which are then also removed.

Figure 4:
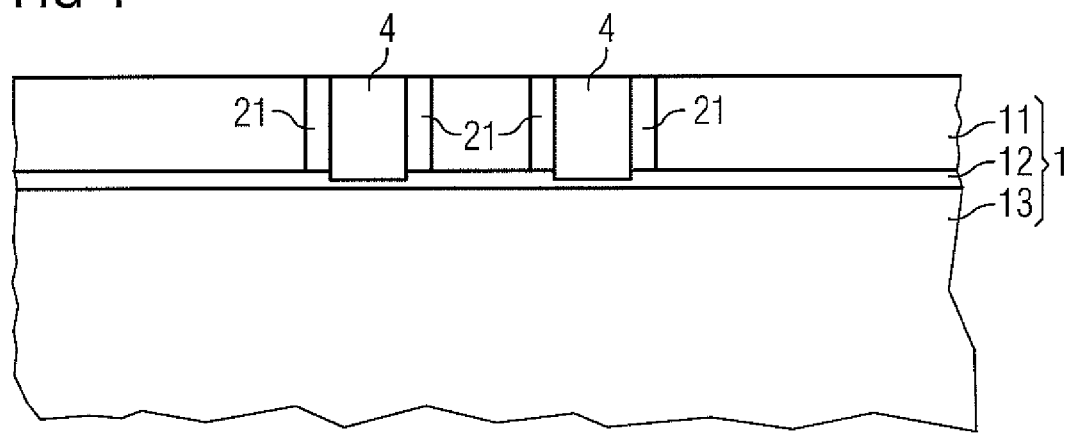
FIG. 4 shows a cross section according to FIG. 3 after a planarization step.

FIG. 4 shows a cross section according to FIG. 3 after planarization of the surface. Of the polysilicon, the contact-hole fillings 4 in the openings remain. These contact-hole fillings are electrically insulated from the semiconductor material of the body silicon layer 11 by the remaining portions of the dielectric layer 21. In the example shown here, no direct electric contact between the contact-hole fillings 4 and the material of the bulk silicon layer 13 is present. Because the dielectric layer 21 has been removed from the upper surface of the body silicon layer 11, the upper surface of the semiconductor material of the body silicon layer 11 is bare. Processing steps known per se then follow for the production of electronic circuit components, in particular of CMOS circuits.

Figure 5:
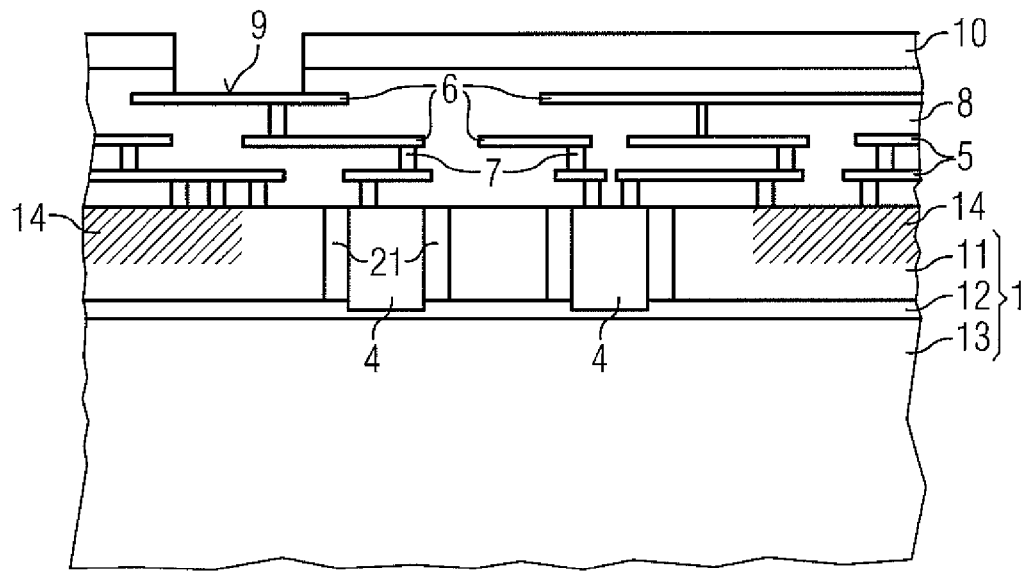
FIG. 5 shows a cross section according to FIG. 4 after the production of a wiring.

FIG. 5 shows a cross section of another intermediate product after the production of top-side wiring. The circuit components of the integrated circuit now produced are formed, for example, in the regions of the body silicon layer 11 marked with the cross-hatching 14. The wiring can be produced in a known way by applying several metallization layers 5, which are separated from each other by intermetal dielectric 8. In the metallization layers 5, conductor tracks 6 are structured, which are connected to each other by means of electrically conductive vertical connections 7 between the metallization layers 5. This is schematically indicated in FIG. 5, wherein the conductor tracks 6 and connections 7 can, however, have basically any configuration. In the shown example, the contact-hole fillings 4 are provided with a different number of such vertical connections 7. Additional vertical connections 7 are located on the connection areas of the electronic components to be contacted in the region of the cross-hatching 14. In this way, an electronic circuit is integrated in the substrate, which can be connected by means of the interlayer connections to be produced in the substrate to electronic circuits in other substrates that are arranged above or below the substrate, which allows a three-dimensional or cubic integration of the integrated circuits.

For the connection to another substrate, in the shown example there is a terminal contact area 9 on the upper side, which is advantageously formed in the topmost metallization plane 5. The size and number of such terminal contact areas 9 are basically arbitrary, and can be selected according to the requirements of the corresponding circuit. Here it is possible to connect the contact-hole filling 4 in an electrically conductive way to a terminal contact area 9 arranged on the upper side, as indicated in FIG. 5 for the contact-hole filling 4 drawn on the left. The completed component thus obtains a vertical interlayer connection through the entire substrate with which a terminal contact on the upper side is connected in an electrically conductive way to a reverse-side terminal contact. Instead of this (or also in addition to this) a contact-hole filling 4 can be connected to a terminal of the integrated electronic circuit (in the shown example within the region of the cross-hatching 14), as indicated in FIG. 5 for the contact-hole filling 4 drawn on the right. In addition, a contact-hole filling 4 can be connected to different metallization layers, as likewise indicated in FIG. 5 for the contact-hole filling 4 drawn on the right.

In the example, a passivation 10 is also deposited on the upper surface, which can be a material known per se for this purpose like silicon nitride, for example. In the region of the terminal contact area 9, both the topmost position of the intermetal dielectric 8 and also the passivation 10 are removed, so that a solder ball or the like may be deposited on the terminal contact area 9 for external electric connection. The vertical interlayer connection through the substrate is produced, after these processing steps, up to the insulation layer 12.

Figure 6:
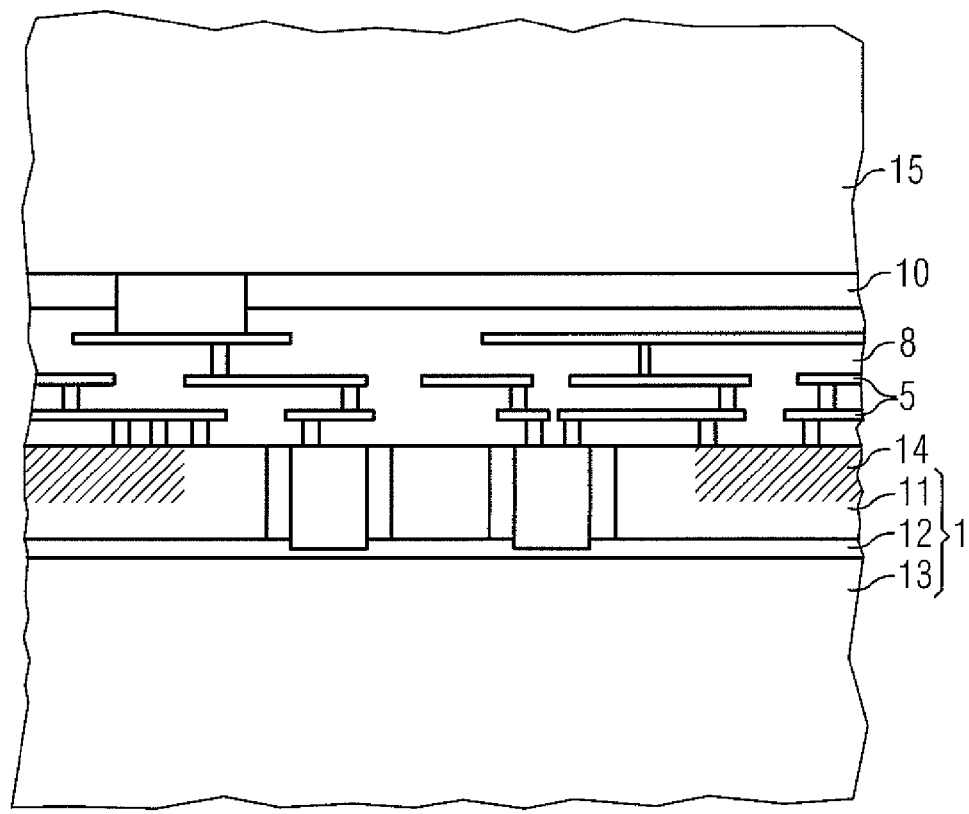
FIG. 6 shows a cross section according to FIG. 5 after the application of a handling wafer.

For the additional processing steps, a handling wafer 15 according to the cross section of FIG. 6 can be applied on the upper side. Optionally, it may be done without the use of a handling wafer. The handling wafer 15 can be significantly thicker than the processed substrate 1 and facilitates thinning the substrate 1 from the reverse side. Here, however, the reverse-side bulk silicon layer 13 can remain significantly thicker than the front-side body silicon layer 11. In feasible embodiments, the thickness of the body silicon layer 11 is typically in the range from 10 μm to 20 μm, while the thickness of the bulk silicon layer 13 is, after thinning, typically in the range from 200 μm to 300 μm.

Figure 7:
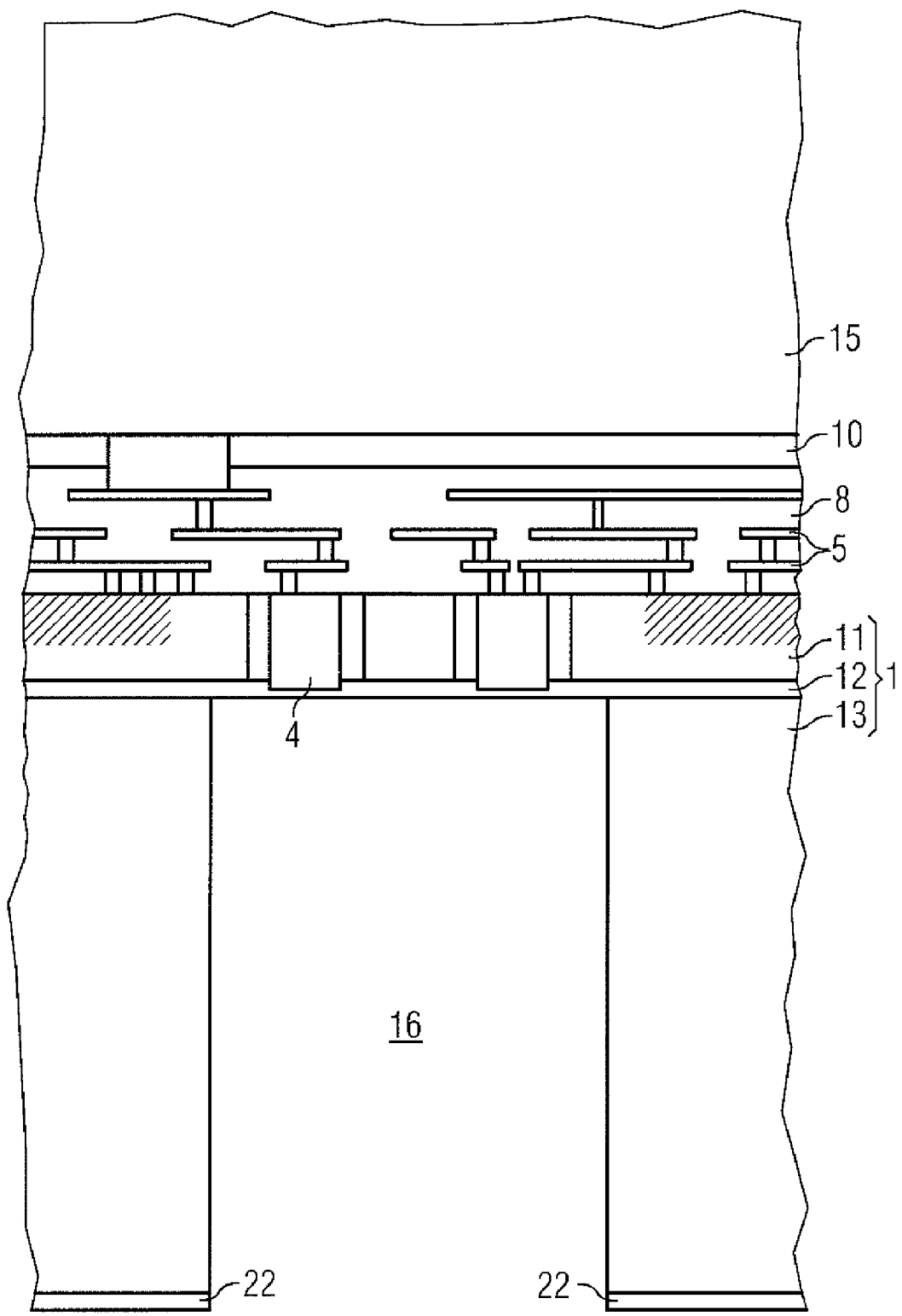
FIG. 7 shows a cross section according to FIG. 6 after the production of a recess in the substrate reverse side.

FIG. 7 shows a cross section according to FIG. 6 after the thinning of the substrate 1 and the production of a reverse-side dielectric layer 22, for example made from oxide, on the reverse-side surface of the bulk silicon layer 13. A recess 16 is etched from the reverse side into the bulk silicon layer 13 in the region of the contact-hole fillings 4, wherein the insulation layer 12 is used as an etching stop layer. Here it is especially advantageous for the insulation layer 12 to have a multi-layer configuration, as has already been described above. In this case, a sublayer of the insulation layer 12, for example the mentioned nitride layer, can also function as an etching stop layer in the etching of recess 16 now performed. The residual thin layer portions of the insulation layer 12 remaining under the contact-hole fillings 4, that is, for example, this nitride layer, are provided to protect the polysilicon of the contact-hole fillings 4 against the etching attack.

Figure 8:
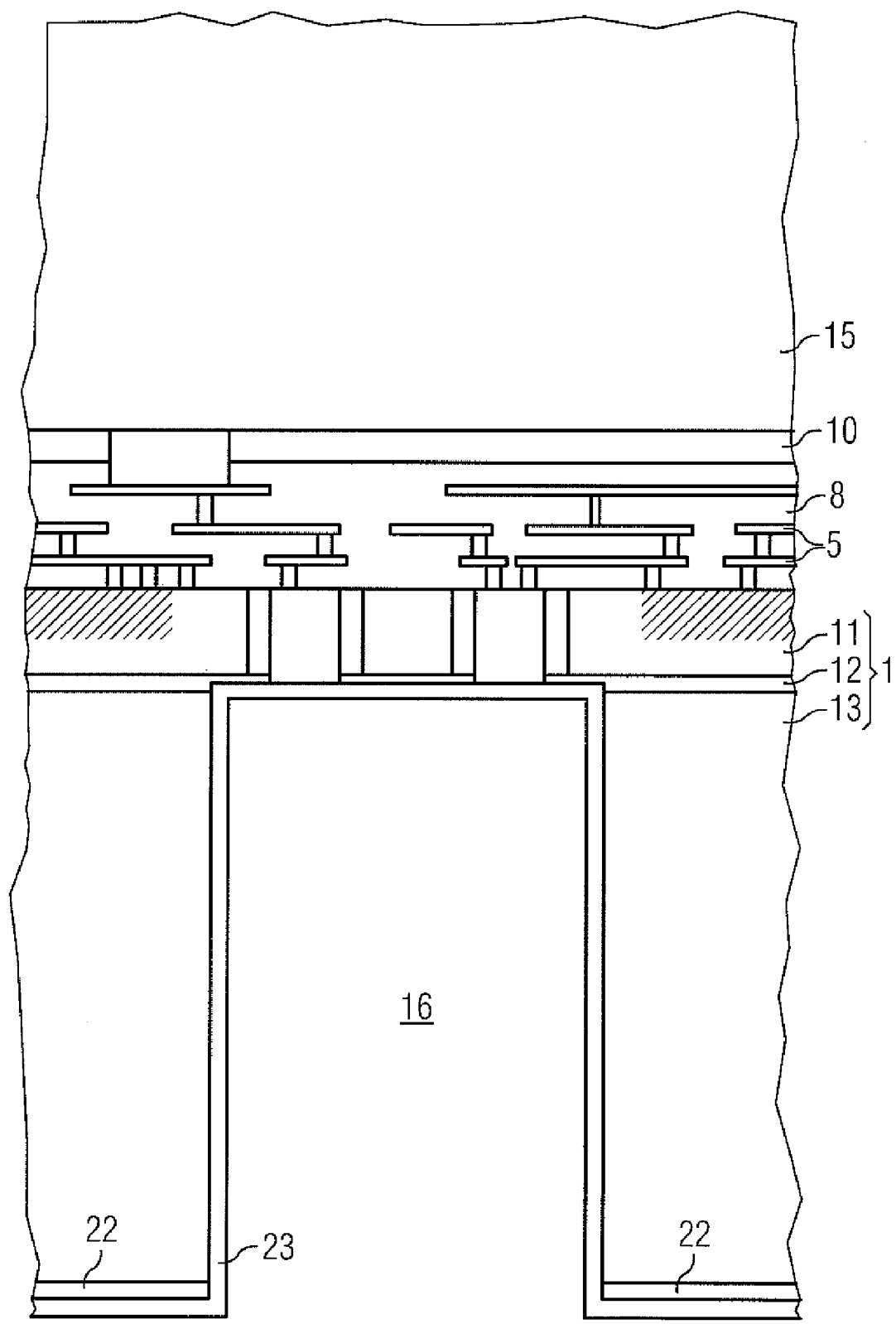
FIG. 8 shows a cross section according to FIG. 7 after the production of insulation on the side walls of the recess.

FIG. 8 shows a cross section according to FIG. 7 after removal of the remaining portions of the insulation layer 12 from the reverse-side surfaces of the contact-hole fillings 4, for example by anisotropic dry etching, so that the contact-hole fillings 4 are left exposed, and after a processing step with which another dielectric layer 23 has been produced that in particular covers and thus electrically insulates the side walls of the recess 16. The other dielectric layer 23 can be, for example, an oxide of the semiconductor material, in particular silicon dioxide. Optionally the dielectric layer 23 can already be produced before the insulation layer 12 is removed from the reverse-side surfaces of the contact-hole fillings 4.

Figure 9:
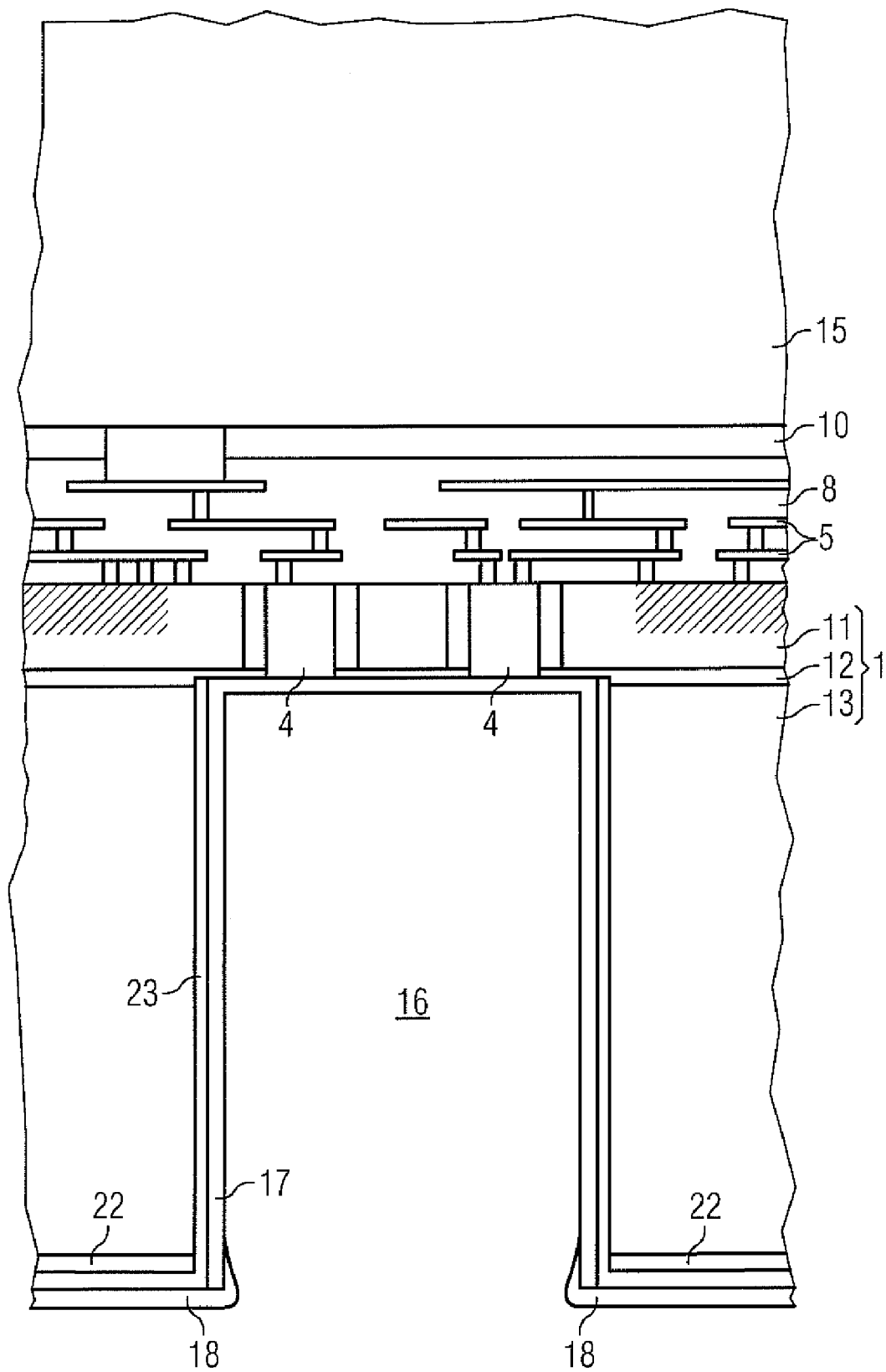
FIG. 9 shows a cross section according to FIG. 8 after the application of a metallization.

After the additional dielectric layer 23 and, if still present there, the insulation layer 12 have been removed from the reverse-side surfaces of the contact hole fillings 4, a metallization 17, which forms an electrically conductive contact with the contact-hole fillings 4, is then deposited from the reverse side according to the cross section of FIG. 9. The metallization 17 mainly comprises a metal, such as tungsten, but may also be a layer sequence made from different metals. In a typical embodiment of such a layer sequence, initially a thin titanium layer is deposited as a liner, then a TiN layer as a barrier layer, and on top a layer made from tungsten. The barrier layer prevents the diffusion of tungsten atoms into the semiconductor material. Preferably the metallization 17 is removed from the reverse-side surface of the substrate, which is done, for example, by anisotropic etching, so that it covers as a layer only the inner surfaces and the base of the recess 16. For the external electric connection a contact layer 18 is produced, which can be produced, for example, by sputtering. As indicated in the cross section of FIG. 9, here a portion of the material of the contact layer 18 also reaches the lateral surfaces of the metallization 17, so that a good electrically conductive connection is produced between the metallization 17 and the contact layer 18. The contact layer 18 is a metal preferred for terminal contacts, for example aluminum.

Figure 10:
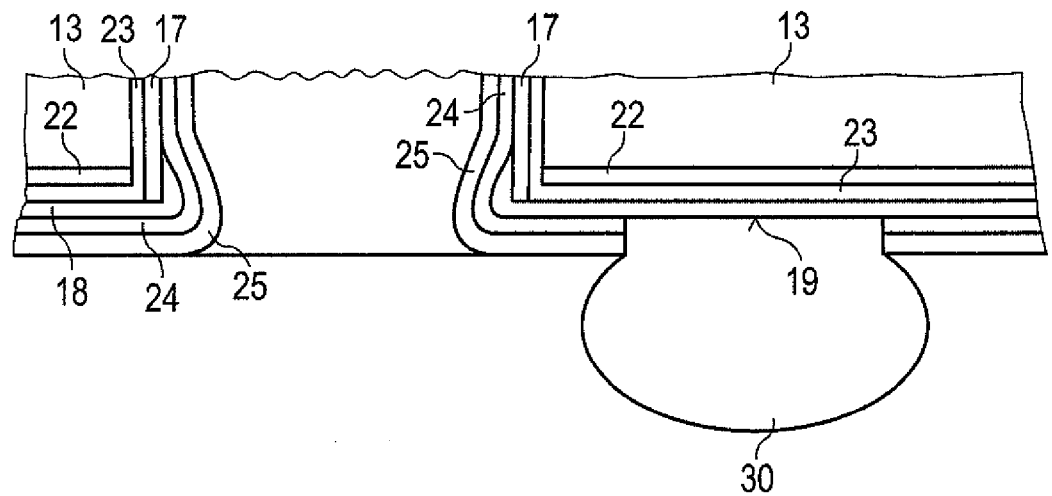
FIG. 10 shows a cutout from the cross section according to FIG. 9 after the production of top-side insulation and the application of solder balls for external electric connection.

As shown in a cutout in the cross section of FIG. 10, dielectric material is then deposited on the reverse side, in particular a dielectric layer 24 made from oxide and another dielectric layer 25 made from nitride. An opening in the dielectric layers 24, 25 exposes a terminal contact surface 19 on the contact layer 18, on which a solder ball 30 can be deposited for external electric connection, especially to another substrate.

Figure 11:
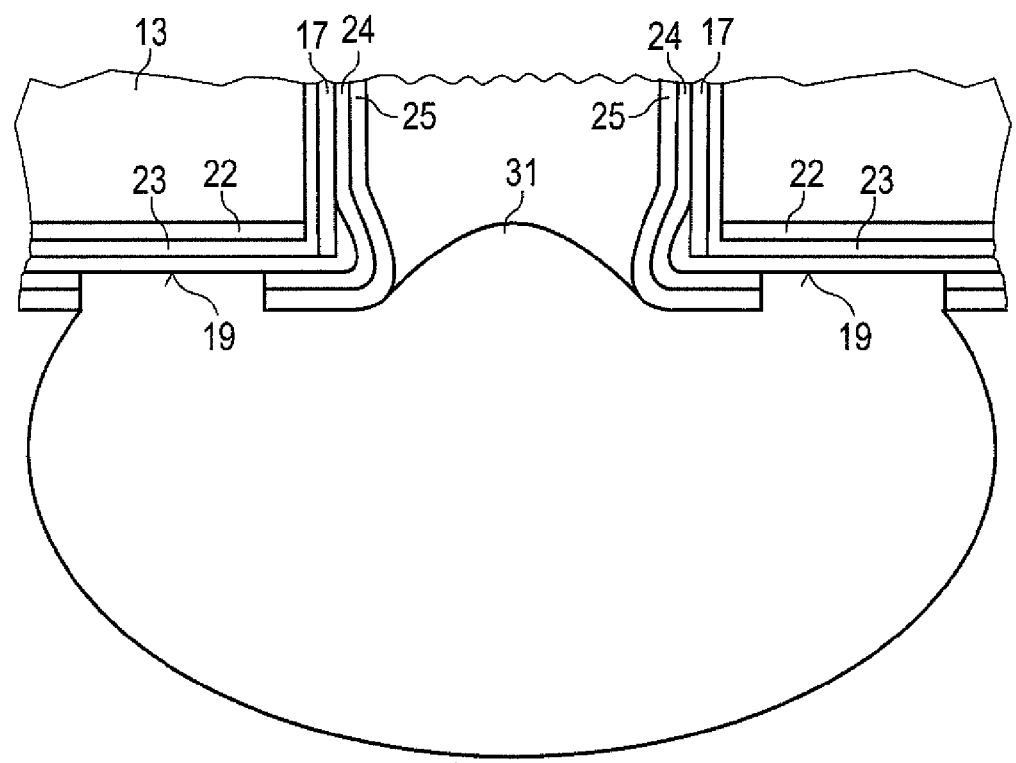
FIG. 11 shows a cross section according to FIG. 10 for an alternative embodiment of the electric connection.

FIG. 11 shows an embodiment, which is alternative to the embodiment according to FIG. 10, and in which the terminal contact area 19 surrounds the recess 16, and the solder ball 31 is deposited so that it closes the recess 16. In this way, the reverse-side area of the substrate occupied by the recess 16 can be used for the electric connection. In particular, if several interlayer connections are provided in the substrate and thus several solder balls are deposited on the reverse side for electric connection, this configuration enables attaching the solder balls in a space-saving way, and better utilizing the reverse-side area of the substrate.

In the embodiments of the method in which the contact-hole fillings 4 are polysilicon, there is also the possibility of performing an implantation of additional dopants into the contact-hole fillings with the implantation steps provided for the formation of the integrated circuit. With such an implantation upper regions of the contact-hole fillings may be formed as more highly doped terminal contact areas. Thus, a low impedance transition resistor may be produced between the metal of the wiring and the polysilicon of the contact-hole fillings.

The diameter of a contact hole filling provided for an interlayer connection is typically about one to two micrometers. The diameter of the reverse-side recess 16 is typically in the range from 50 μm to 500 μm, preferably in the range from 50 μm to 100 μm, and is, for example, approximately 100 μm with a depth of the recess 16 of approximately 250 μm. The depth of the recess 16 typically lies in the range from 200 μm to 725 μm, preferably in the range from 200 μm to 300 μm. In a plurality of embodiments, the reverse-side terminal contact area 19 can be configured in a manner known per se and may be dimensioned for typical solder balls; it can have, for example, a typical dimension of approximately 300 μm to 400 μm side length or diameter. In the case of embodiments according to FIG. 11, the terminal contact area 19 can optionally have larger dimensions.

Figure 12:
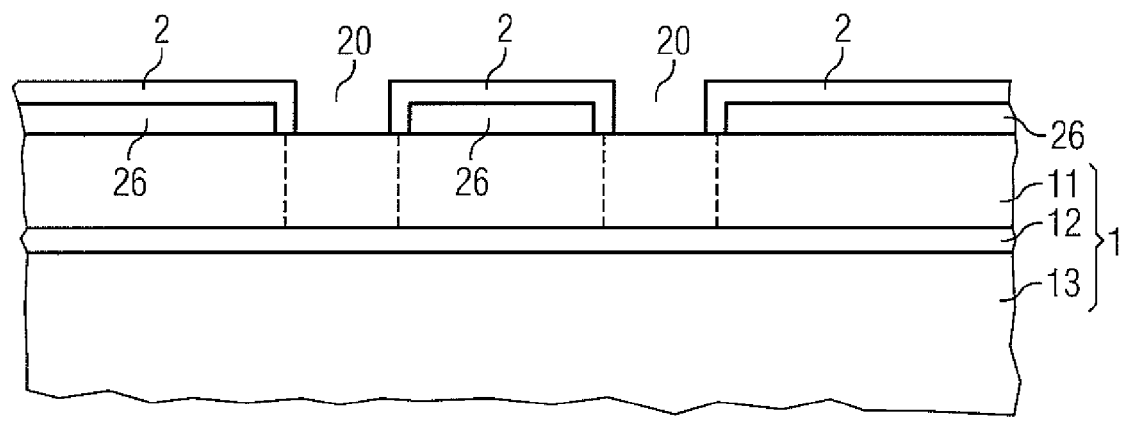
FIG. 12 shows a cross section of an intermediate product corresponding to FIG. 1 for another embodiment of the method.

Instead of polysilicon the contact-hole fillings can also be produced from metal. Such an embodiment starts, for example, with the configuration that is shown in cross section in FIG. 12 corresponding to the cross section of FIG. 1. It may start with an SOI substrate 1, which has a body silicon layer 11, which is separated by an insulation layer 12 from a thicker bulk silicon layer 13. On the upper surface of the body silicon layer 11 a dielectric layer 26 is deposited, which may be, for example, an oxide of the semiconductor material. On this, the mask 2, in particular a resist mask, is produced, which is provided with openings 20 in the region of the interlayer connections to be produced. The portion etched from the body silicon layer 11 is marked in FIG. 12 again by vertical dashed lines.

Figure 13:
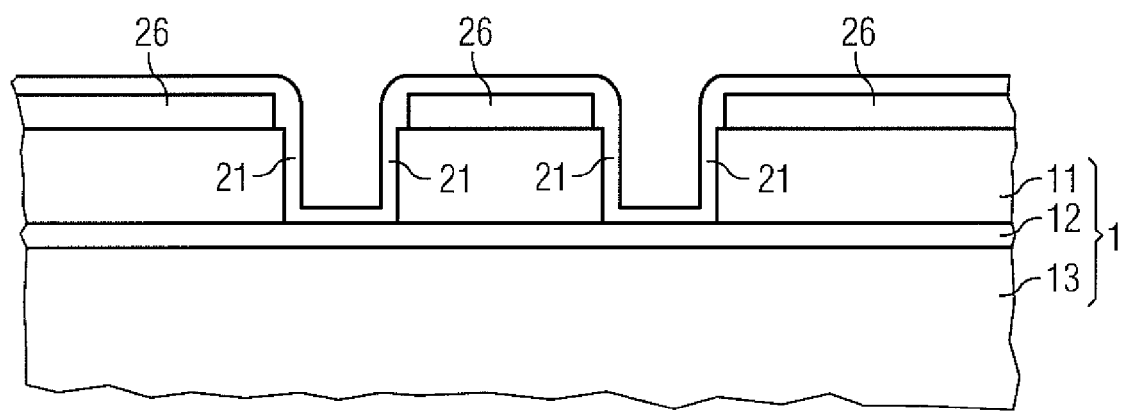
FIG. 13 shows a cross section according to FIG. 12 after the production of side-wall insulation of the contact holes.

FIG. 13 shows the cross section of another intermediate product after the etching of the openings and the production of the dielectric layer 21, with which the side walls of the openings are covered, so that the semiconductor material of the body silicon layer 11 is insulated there electrically.

Figure 14:
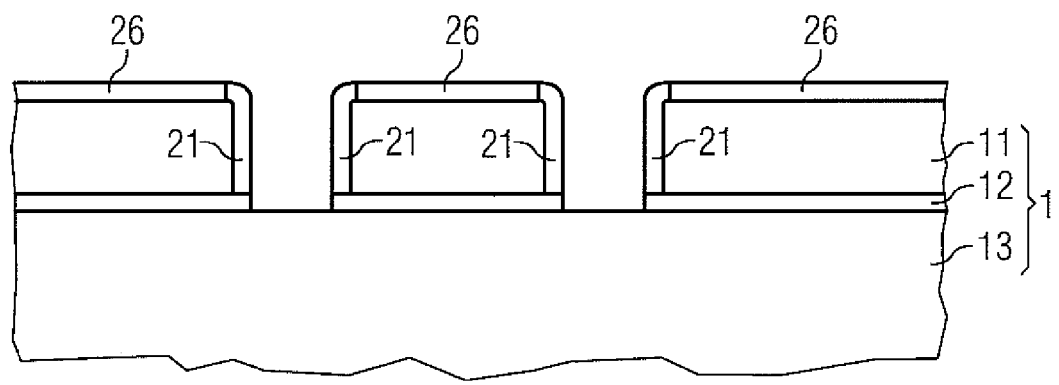
FIG. 14 shows a cross section according to FIG. 13 after opening of the insulation layer in the contact holes.

Following this is an anisotropic etching step, with which the structure is produced that is shown in cross section in FIG. 14. In this embodiment, the material of the insulation layer 12 within the openings that are provided for the contact-hole fillings is removed up to the bulk silicon layer 13. The semiconductor material of the bulk silicon layer 13 therefore lies open within the openings. Instead of this, however, in this embodiment with metallic contact-hole fillings, it is also possible, corresponding to the previously described embodiment with polysilicon, to leave one or more layer portions of the insulation layer 12 initially remaining, which are then removed in the corresponding later processing steps from the reverse-side surfaces of the contact-hole fillings. In this way, use is also made in this embodiment of the etching stop layer. Residual layer portions of the dielectric layer 26 are still present on the upper surface of the body silicon layer 11. The dielectric layer 21 insulates the side walls of the openings into which the material of the contact-hole fillings is introduced.

Figure 15:
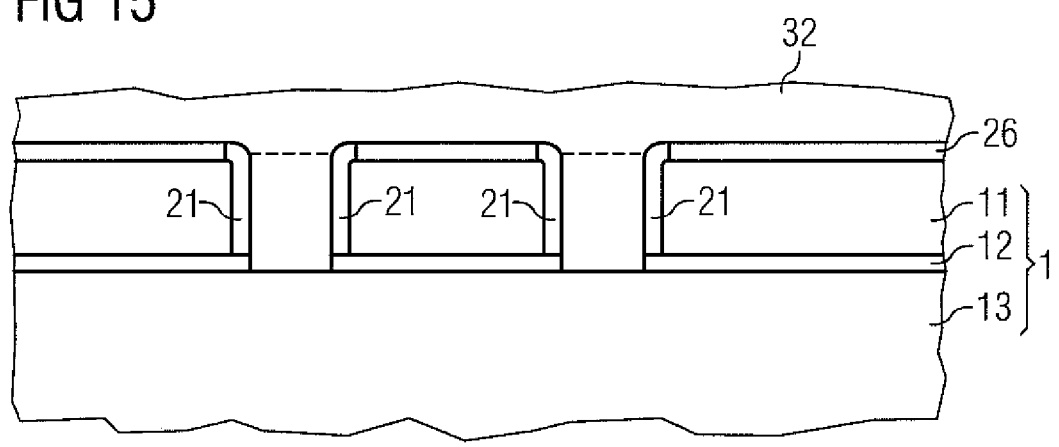
FIG. 15 shows a cross section according to FIG. 14 after the introduction of a metal.

FIG. 15 shows the intermediate product after the introduction of the metal 32 provided for the contact-hole fillings. This metal 32 can be tungsten, for example. For the contact-hole fillings it is also advantageous if not only tungsten is introduced, but also a thin titanium layer is deposited in advance as a liner and on the titanium a similarly thin layer made from TiN is deposited as a barrier layer, which stops diffusion of the metal atoms of the tungsten layer into the semiconductor material. The metal 32 is then made planar with back-etching, which can be effected, for example, by means of CMP (chemical mechanical polishing) or RIE (reactive ion etching).

Figure 16:
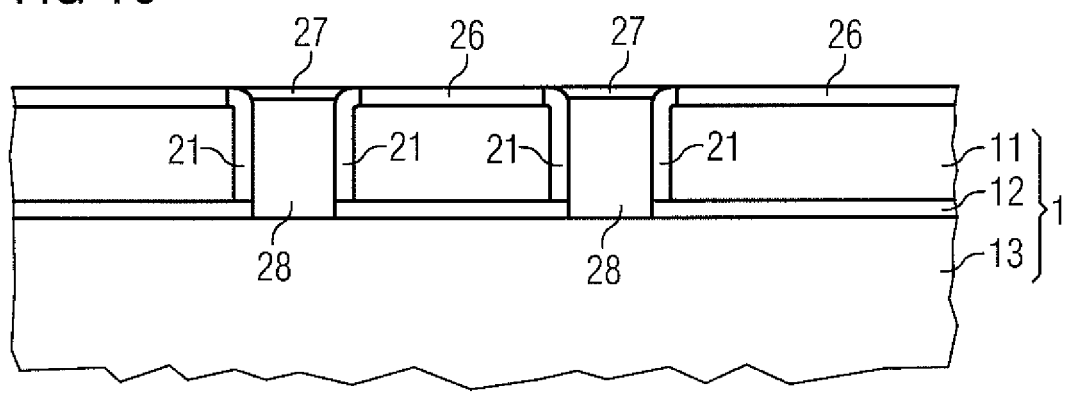
FIG. 16 shows a cross section according to FIG. 15 after planarization and the application of top-side insulation.

FIG. 16 shows in cross section the intermediate product after the planarizing back-etching of the metal and the top-side application of another dielectric layer 27, which forms thin upper insulation on the contact-hole fillings 28 after another planarization step. As can be seen in FIG. 16, the contact-hole fillings 28 produced in this way can project slightly beyond the upper surface of the body silicon layer 11 due to the presence of the residual layer portions of the dielectric layer 26. This can also be seen in the following FIG. 17.

Figure 17:
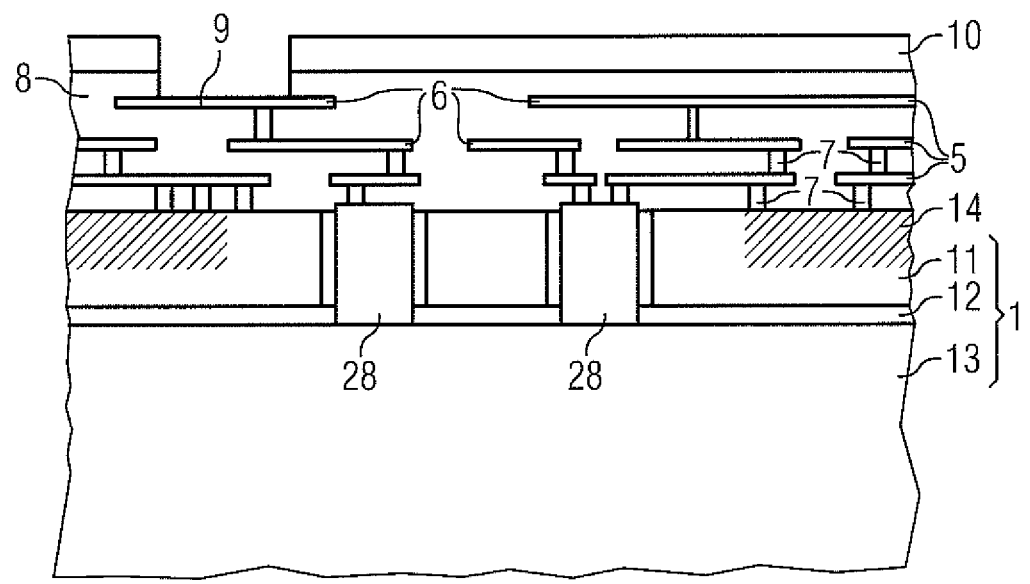
FIG. 17 shows a cross section according to FIG. 16 after production of a wiring.

FIG. 17 shows a cross section corresponding to FIG. 5 after production of the wiring. In order to highlight those differences between the embodiments that are relevant to the described method, the same wiring structure appears in all described embodiments. The wiring, however, may vary according to the relevant integrated circuit. Following now are the processing steps explained with reference to FIGS. 6 to 9 corresponding to the previously described embodiment. The reverse-side connections by means of solder balls can also be produced according to FIG. 10 or 11. It should also be mentioned that, in contrast to the previously described embodiment, at most the additionally deposited dielectric layer 23 has to be removed from the contact-hole fillings before the production of the metallization 17 within the reverse-side recess 16, because the insulation layer 12 has already been removed there. Because the contact-hole fillings 28 in this embodiment are metal and not semiconductor material, an etching stop layer for the etching of the recess 16 is not required. The semiconductor material of the bulk silicon layer 13 can be etched selectively with respect to the metal of the contact-hole fillings 28.

Figure 18:
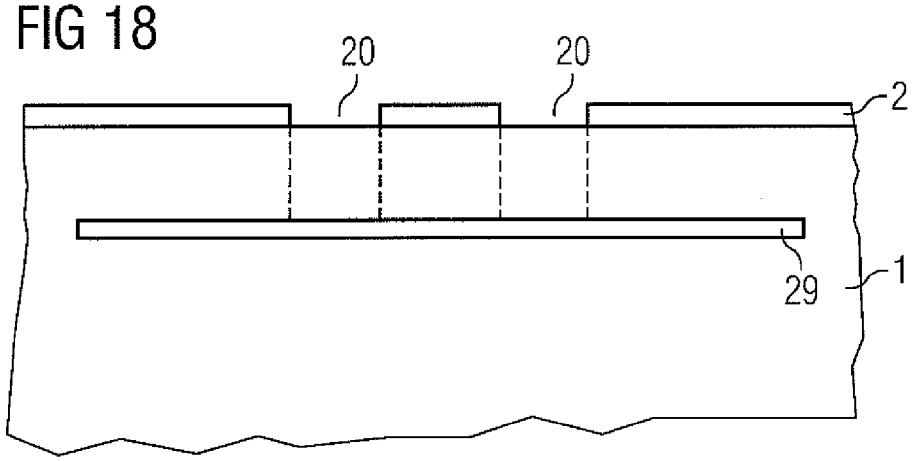
FIG. 18 shows a cross section according to FIG. 1 for another embodiment with a laterally delimited insulation layer.

Instead of using a conventional SOI substrate, it is also possible to form the insulation layer as an insulation layer buried in the semiconductor material and delimited laterally within the semiconductor material. In this case, an intermediate product according to FIG. 1 has, for example, the structure shown in cross section in FIG. 18. In the substrate 1, an insulation layer 29 is buried, which may be laterally confined essentially to the region provided for the interlayer connections. This can be regarded as a SOI structure that is only locally present.

Figure 19:
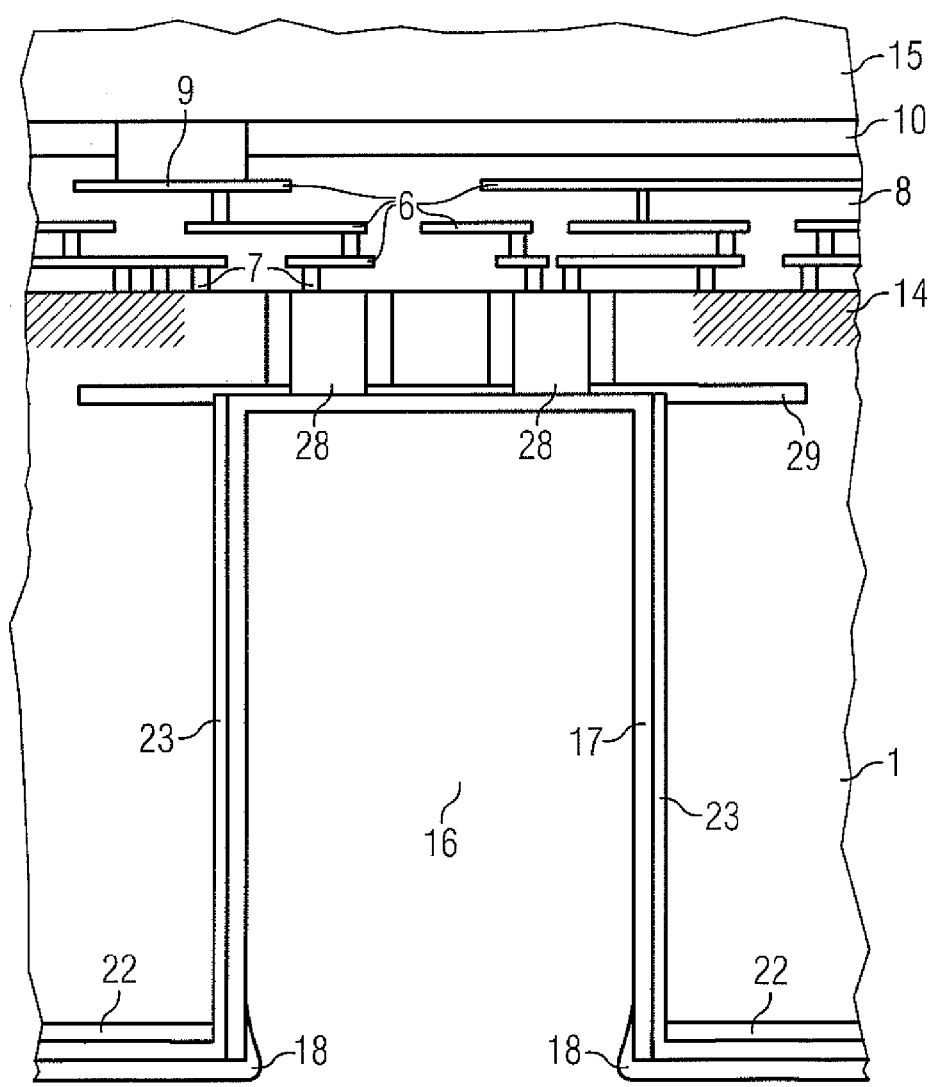
FIG. 19 shows a cross section according to FIG. 9 for the embodiment of FIG. 18.

Such a structure can be produced starting with a semiconductor body, in particular a silicon wafer, in that a dielectric layer corresponding to the insulation layer to be produced is produced and structured on an upper surface of the wafer. By means of subsequent epitaxial growth silicon is grown on the upper surface of the wafer provided with the dielectric layer (ELO, epitaxial lateral overgrowth). Then a reflow step is performed at about 1000° C. to 1200° C. and a high $H_2$ flow rate, in order to generate a flow and planarization of the grown silicon above the dielectric layer, which is now buried. In this way the substrate shown in cross section in FIG. 18 with the buried insulation layer 29 is obtained. The additional processing steps may follow according to the already described embodiments. To illustrate the result, a cross section corresponding to FIG. 9 is shown in FIG. 19 for an embodiment with a local SOI structure.

Figure 20:
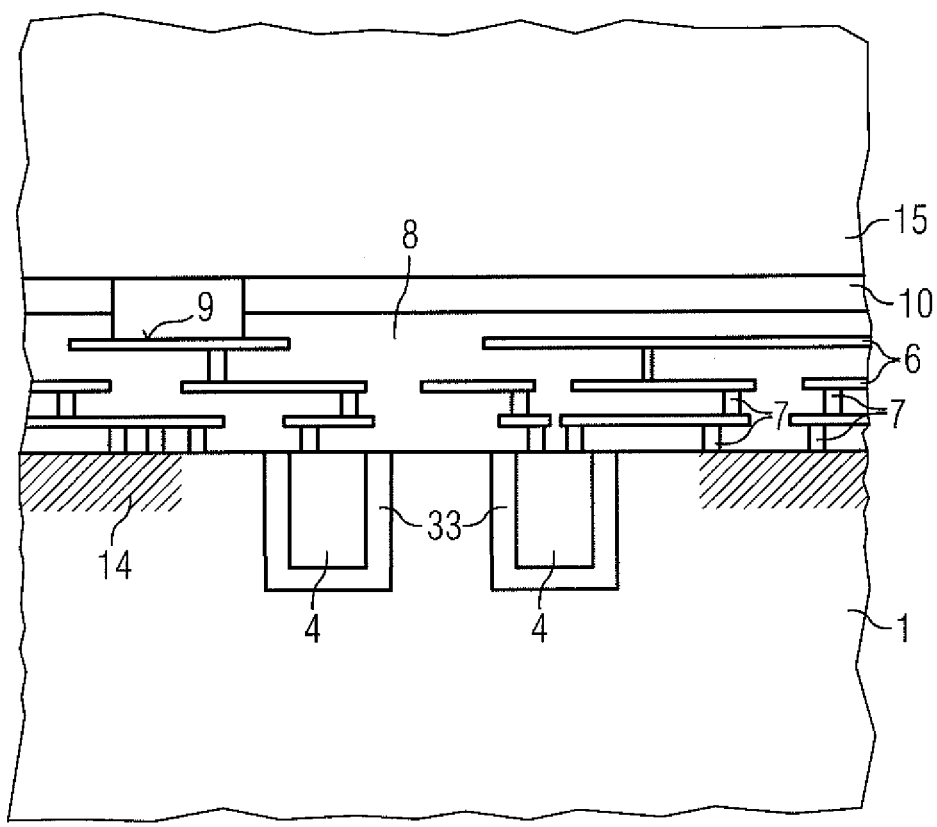
FIG. 20 shows a cross section according to FIG. 5 for another embodiment of the method.
Figure 21:
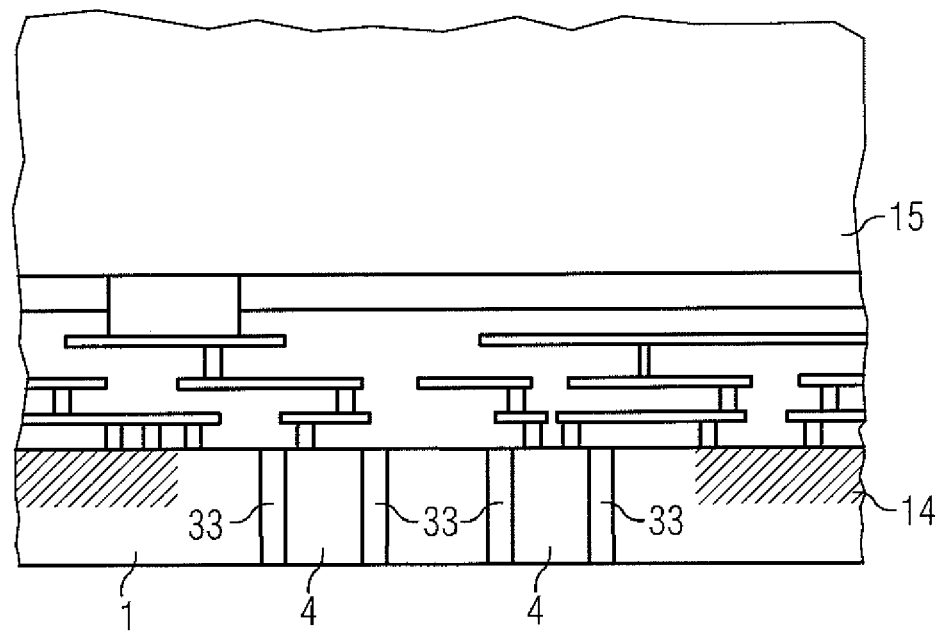
FIG. 21 shows a cross section according to FIG. 20 after etch-back of the substrate.

Another possibility for producing the semiconductor substrate with interlayer connection is described with reference to FIGS. 20 to 23. FIG. 20 shows a cross section according to FIG. 5 of an intermediate product that is obtained when a semiconductor body without an insulation layer is initially used as substrate, and contact holes are produced on an upper surface of the substrate, using a mask. The inner surfaces of the contact holes are provided with a dielectric layer 33, which may be an oxide, for example. Then a contact-hole filling 4 is introduced into the contact holes, for which polysilicon or metal can be used, for example, as in the already described embodiments. Further processing steps follow, with which the integrated circuit including the wiring is completed according to the previously described embodiments. For better handling a handling wafer 15 may be attached to the upper side. The result of this processing step is shown in FIG. 20 by way of an example.

The substrate 1 is then thinned from the reverse side until the reverse side surfaces of the contact-hole fillings 4 are exposed. The intermediate product obtained in this way is shown in cross section in FIG. 21.

Figure 22:
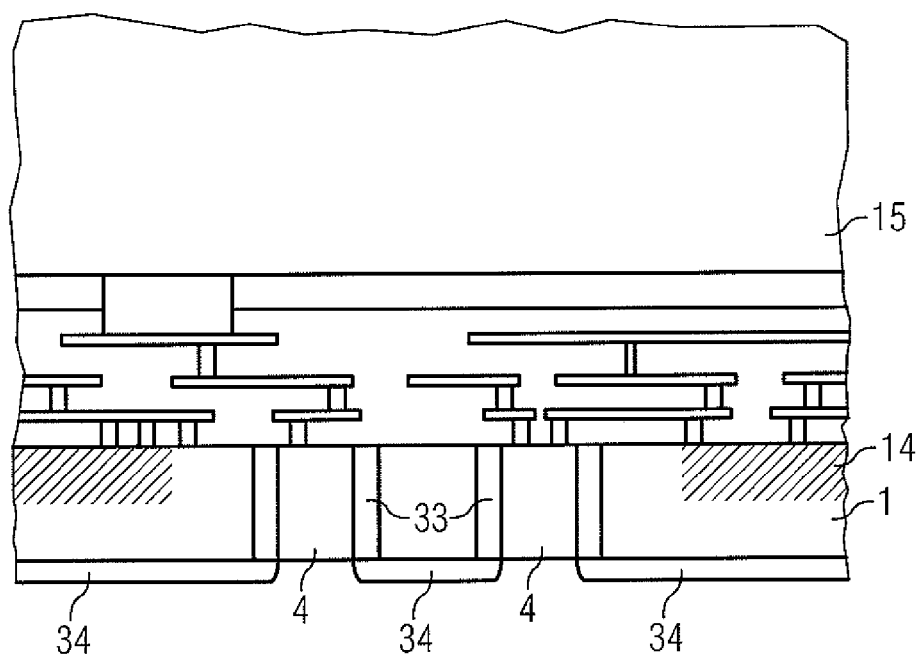
FIG. 22 shows a cross section according to FIG. 21 after the application of a bonding layer.

Then, according to the cross section of FIG. 22, a bonding layer 34, which may be an oxide, for example, is deposited and structured on the reverse side.

Figure 23:
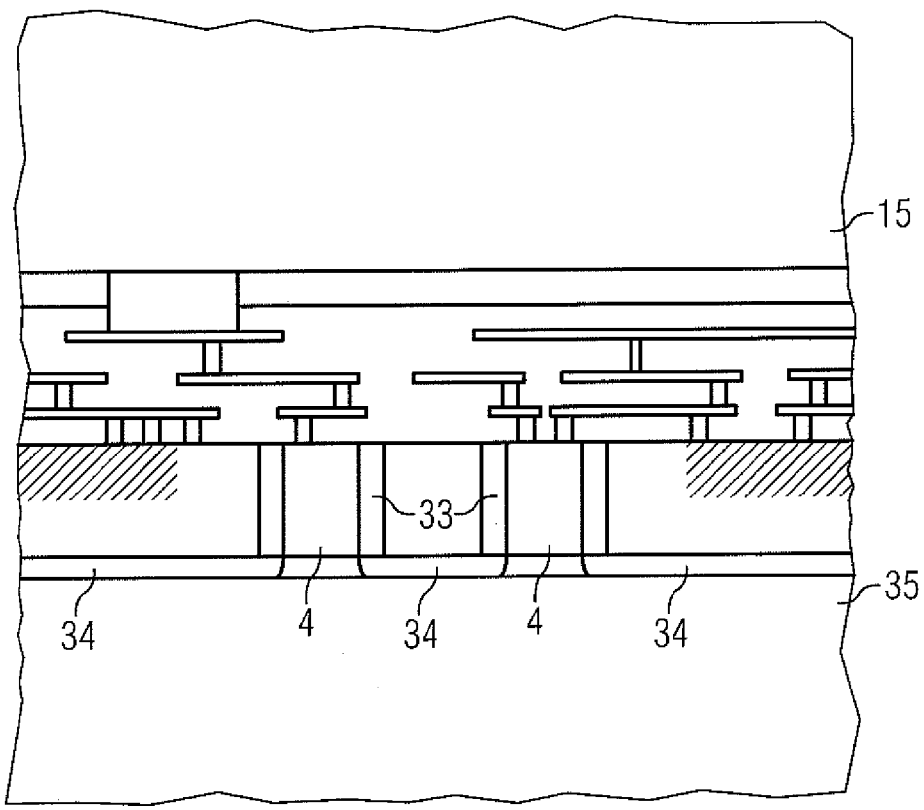
FIG. 23 shows a cross section according to FIG. 22 after bonding of a reverse-side wafer.

FIG. 23 shows another intermediate product after the bonding of a reverse-side wafer 35. Additional processing steps, with which the reverse-side recess 16 is produced and is provided with a metallization 17, follow according to the previously described embodiments. As a result a structure is obtained that is essentially similar to the structure shown in FIG. 9, with the difference that the insulation layer 12 is replaced by the bonding layer 34.

The described method and structure of the semiconductor substrate achieved in this way has the advantage that a high etching rate is possible during production and, on the other hand, the interlayer connections require only a comparatively small portion of the substrate surfaces. In particular, the embodiments with a solder ball spanning the reverse-side recess allow a plurality of interlayer connections of the substrate to be produced for a comparatively low required percentage of the area of the substrate surfaces.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

The invention claimed is:

1. A semiconductor substrate with interlayer connection, comprising:
    layers of semiconductor material and an insulation layer arranged between the layers of semiconductor material, the insulation layer being a multiple layer;
    at least one contact-hole filling arranged in a layer of the layers of semiconductor material, the contact-hole filling penetrating said layer,
    a recess arranged in and penetrating a layer of semiconductor material opposite to the contact-hole filling, and being provided with a metallization; and
    an electrically conductive contact between the contact-hole filling and the metallization, the electrically conductive contact being arranged in the insulation layer.

2. The semiconductor substrate according to claim 1, wherein the insulation layer comprises at least one of (i) a nitride layer and (ii) at least one oxide layer.

3. The semiconductor substrate according to claim 1, wherein the insulation layer is an oxide-nitride-oxide layer sequence.

4. A method of producing a semiconductor substrate with interlayer connection, comprising:
    a substrate of semiconductor material being provided with an insulation layer embedded in the semiconductor material;
    producing at least one opening in the substrate, using a mask, the insulation layer being exposed in the opening;
    forming a dielectric layer covering the semiconductor material in the opening;
    introducing an electrically conductive material into the opening, forming a contact-hole filling;
    producing a recess in the substrate opposite to the contact-hole filling, the insulation layer being exposed in the recess;
    forming a further dielectric layer covering the semiconductor material in the recess;
    exposing the contact-hole filling from the recess;
    applying a metallization in the recess, the metallization electrically contacting the contact-hole filling; and
    forming a contact area, the contact area being electrically connected to the contact-hole filling.

5. The method according to claim 4, further comprising:
    with the substrate being an SOI substrate having a body silicon layer and a bulk silicon layer, arranging the insulation layer between the body silicon layer and the bulk silicon layer;
    producing the opening in the body silicon layer; and
    producing at least one electronic component in the body silicon layer.

6. The method according to claim 4, further comprising:
    forming the substrate of a semiconductor body;
    providing the semiconductor body with a laterally confined insulation layer on a surface of the semiconductor body;
    applying further semiconductor material, the insulation layer being embedded in the semiconductor material; and
    planarizing the semiconductor material.

7. The method according to claim 4, further comprising:
thinning the insulation layer in the opening to a residual layer portion before the electrically conductive material is introduced into the opening;
depositing the electrically conductive material on the residual layer portion of the insulation layer;
etching such that the residual layer portion of the insulation layer is an etching stop layer during the production of the recess; and
removing the residual layer portion of the insulation layer from the contact-hole filling before the application of the metallization.

8. A method for producing a semiconductor substrate with interlayer connection, comprising:
providing a substrate of semiconductor material with an opening with inner surfaces, using a mask;
forming a dielectric layer on the inner surfaces of the opening;
introducing an electrically conductive material into the opening, forming a contact-hole filling;
thinning the substrate from a reverse side opposite to the contact-hole filling until a reverse-side surface of the contact-hole filling is exposed;
forming a bonding layer on the reverse side;
fastening a wafer to the bonding layer;
producing a recess in the wafer;
forming a further dielectric layer covering the semiconductor material in the recess;
exposing the contact-hole filling from the reverse side;
applying a metallization in the recess, the metallization electrically contacting the contact-hole filling; and
forming a contact area, the contact area being electrically connected to the contact-hole filling.

9. The method according to claim 8, wherein the contact-hole filling is formed electrically conductive doped polysilicon.

10. The method according to claim 9, further comprising:
producing CMOS components after the production of the contact-hole filling;
forming a wiring by metallization layers and intermetal dielectric, the contact-hole filling being electrically connected to the contact area; and
subsequently producing the recess on the side of the insulation layer opposite to the contact-hole filling.

11. The method according to claim 8, wherein the contact-hole filling is formed from metal.

12. The method according to claim 11, comprising:
producing CMOS components before the production of the contact-hole filling;
forming a wiring by metallization layers and intermetal dielectric after the production of the contact-hole filling, the contact-hole filling being electrically connected to the contact area; and
subsequently producing the recess on the side of the insulation layer opposite to the contact-hole filling.

13. The method according to claim 8, further comprising:
providing a further contact area on the reverse side and being connected to the metallization; and
applying a solder ball covering the recess on the further contact area.

14. The method according to claim 4, wherein the contact-hole filling is formed from electrically conductive doped polysilicon.

15. The method according to claim 4, wherein the contact-hole filling is formed from metal.

16. The method according to claim 15, comprising:
producing CMOS components before the production of the contact-hole filling;
forming a wiring by metallization layers and intermetal dielectric after the production of the contact-hole filling, the contact-hole filling being electrically connected to the contact area; and
subsequently producing the recess on the side of the insulation layer opposite to the contact-hole filling.

17. The method according to claim 4, further comprising:
providing a further contact area on the reverse side and being connected to the metallization; and
applying a solder ball covering the recess on the further contact area.

* * * * *